United States Patent [19]

Bergemont

[11] Patent Number: 4,887,238

[45] Date of Patent: Dec. 12, 1989

[54] NON-VOLATILE MEMORY WITH FLOATING GRID AND WITHOUT THICK OXIDE

[75] Inventor: Albert Bergemont, La Tronche, France

[73] Assignee: SGS Thomson-Microelectronics SA, Gentillye, France

[21] Appl. No.: 207,050

[22] PCT Filed: Sep. 11, 1987

[86] PCT No.: PCT/FR87/00353
§ 371 Date: May 16, 1988
§ 102(e) Date: May 16, 1988

[87] PCT Pub. No.: WO88/02172
PCT Pub. Date: Mar. 24, 1988

[30] Foreign Application Priority Data

Sep. 16, 1986 [FR] France .............................. 86 12940

[51] Int. Cl.[4] ....................... G11C 11/40; H01L 29/78
[52] U.S. Cl. ................................... 365/185; 357/23.11
[58] Field of Search ....................... 365/18.5; 357/23.5, 357/23.11, 45

[56] References Cited

U.S. PATENT DOCUMENTS

| | | | |
|---|---|---|---|
| 4,151,021 | 4/1979 | McElroy | 357/41 |
| 4,258,466 | 3/1981 | Kuo et al. | 357/59 |
| 4,361,847 | 11/1982 | Harari | 365/185 |
| 4,384,349 | 5/1983 | 365 | 218/4,258,466 |
| 4,727,515 | 2/1988 | Hsu | 365/185 |

Primary Examiner—James W. Moffitt
Attorney, Agent, or Firm—Oblon, Spivak, McClelland, Maier & Neustadt

[57] ABSTRACT

Electrically programmable non-volatile memories, more currently known as EPROM memories. The memory according to the invention, using floating grid transistors with injection by hot carriers has an architecture which is different from that of conventional memories. Instead of having each transistor connected between a bit line and a mass line to Vss, here each transistor is connected between two adjacent bit lines; for example, in the drawing annexed, the transistor T12 of which the grid is controlled by the word line LM1, has its source connected to the bit line LB1 and its drain connected to the bit line LB2 immediately adjacent to LB1. Advantages result from such an arrangement from the point of view of size, since insulating the drains of the two adjacent transistors by means of a thick oxide is no longer necessary.

7 Claims, 4 Drawing Sheets

FIG. 4
SECTION AA'

FIG. 5
SECTION BB'

NON-VOLATILE MEMORY WITH FLOATING GRID AND WITHOUT THICK OXIDE

The present invention concerns memories and, more particularly, electrically programmable non-volatile memories or electrically programmable read-only memories more commonly known as EPROMs. It relates more precisely to the manufacture of memories with floating grid. To obtain large storage capacity memories, for example memories that can store up to four megabits, the dimensions of each cell constituting the memory should be reduced as far as possible.

However, there are obvious limitations imposed by physical factors and, especially, by the delicacy of the patterns which is made possible by photolithography. There are also limits imposed by unwanted electrical parameters which arise from the manufacturing process and disturb the operation of the memory.

Except a few exceptions, which have not yet achieved success on an industrial scale, all the approaches by which it has been sought to obtain large capacity memories correspond to a technology having the following features:

the individual memory cell consists of a transistor having a floating grid made with a first level of polycrystalline silicon and a control grid made with a second level of polycrystalline silicon, the sources of the transistors are connected to a bus at a low potential Vss, the word line to designate a row of cells is constituted by the second polycrystalline silicon level, the bit line to read the state of a cell is constituted by a metallic line (aluminum) that intersects the word lines and makes contact with the drain of the transistors from place to place, to reduce the size of the memory cell, only one contact point is provided for two adjacent drains of two transistors of the same column, this contact providing the connection to the bit line; similarly only one contact is provided between the sources of two adjacent transistors and the Vss bus, the transistors are separated from one another by a thick layer of silicon oxide (thick as compared with the oxide of the transistor grids), and the bit lines and word lines pass above this thick layer of oxide, finally, a piece of information is written in a cell of the memory as follows: the sources of all the transistors of the memory are at a low potential Vss (for example zero volt); the word line connected to the control grid of the cell to be programmed is raised to a programming voltage Vpp (for example 15 volts) while all the other word lines are at the low potential Vss; the bit line corresponding to the cell to be programmed is raised to a high potential Vcc (for example 10 volts) while the bit lines of the cells which should not be programmed are held at the low potential Vss.

With this memory architecture and the associated programming mode, it is imperative that the drain of a transistor should be electrically insulated, by a thick layer of oxide, from the drain of the adjacent transistors of the same word line, failing which it will not be possible to program a particular memory cell without, at the same time, programming or deprogramming the other memory cells.

However, the thick layer of oxide which insulates two adjacent cells takes up a great deal of space, especially when it is made by the so-called localized oxidation technique.

Attempts have been made to replace localized oxidation by insulation with oxide-filled grooves to reduce the overall space factor of the cell, but this technology has not yet been implemented for industrial-scale manufacture.

To reduce the overall space occupied by the cells and thus increase the storage capacity of the memory, the present invention proposes a new memory architecture with which there is no need for insulation by a thick layer of oxide between adjacent transistors and yet allows to retain standard type manufacturing methods if so desired.

The invention also proposes a manufacturing method which is particularly suited to this architecture. According to the invention, the memory consists of an array of word lines, connecting cells in rows, and bit lines, connecting cells in columns, the word lines being conductors used to designate a specific row of cells and the bit lines being conductors used to transmit a piece of informamtion on the logic state of the cells connected to them, each cell, located at the intersection of a specific row and a specific column, comprising a transistor having a control electrode connected to a word line and two main electrodes (drain and source), one connected to a first bit line and the other connected to another bit line adjacent to the first bit line, this other bit line being itself connected to a main electrode of a transistor of a column adjacent to the specific column of which the considered cell forms a part.

In principle, the cell is constituted by a single transistor with a floating grid.

According to a major aspect of the present invention, each transistor has a floating grid and a control grid, and two regions with the same type of conductivity, respectively constituting the two main electrodes of the transistor, these two regions being separated by a channel of opposite conductivity, the transistors of one and the same row having their control grids connected to a common word line and two transistors adjacent to this row sharing the same region with the first type of conductivity.

According to another aspect of the invention, the transistor has a channel region oriented in the same direction as the word lines, i.e. the current in the channel flows in the general direction of the word lines.

According to yet another aspect of the invention, each cell consists of a transistor with a floating grid, and the transistors of one group belonging to two adjacent rows and two adjacent columns are arranged as follows:

each transistor has a floating grid essentially consisting of a conductive rectangle located above a zone with a first type of conductivity constituting the channel of the transistor;

the channels of two adjacent transistors of a same column are separated by a region with the same type of conductivity as the channels;

the channels of two adjacent transistors of a same row are adjacent to a same region with the opposite type of conductivity which separates them and which acts as the source of one of the transistors and as the drain of the other transistor.

According to yet another aspect, the memory according to the invention has programming means arranged to apply the following potentials to the different cells:

a low potential Vss is applied to the word lines of the row of cells which should not be programmed;

a programming potential Vpp is applied to the word line connected to the cell to be programmed;

a drain potential Vcc is applied to all the bit lines located on one side of the column containing the cell to be programmed, and a source potential is applied to all the bit lines located on the other side of the column containing the cell to be programmed;

the source potential, drain potential and programming potential are such that any transistor, which has one main electrode at the source potential, the other main electrode at the drain potential and its electrode at the programming potential, will be programmed and any transistor which has either its two main electrodes at the same potential or its control electrode at low potential will not be programmed (this is the case for standard hot carrier injected transistors with floating grids).

In one embodiment, the memory cell is a floating grid transistor, the floating grid of which extends exactly over the entire channel of the transistor (between the source and the drain).

In another embodiment, the memory cell also consists of a transistor with floating grid but the floating grid, extends over only a part of the channel, the control grid extending directly over the rest of the channel. The manufacturing method of the invention is compatible with standard methods for manufacturing MOS transistor integrated circuits including complementary MOS (CMOS) transistor integrated circuits. In particular, the memory can be manufactured with peripheral circuits (such as decoders) made with standard technology in the thick oxide layer zones prepared by localized oxidation, while the memory block itself does not have any thick layer of oxide.

According to a very important and special feature of the invention, the manufacturing method unexpectedly enables the formation of p+ type semi-conducting regions between the bit lines which are n+ type regions, without any specific masking step o delineate these p+ type regions (the substrate being of p− type).

For this purpose, first of all, n+ type diffused lines of polycrystalline silicon floating grids, in columns, are formed at each memory cell position, and rows of polycrystalline silicon word lines in rows. Then, the surface of the integrated circuit wafer is oxidized in such a way that wherever the semi-conducting substrate is not covered with polycrystalline silicon, oxide is formed with greater thickness in the n+ type doped regions and smaller thickness in the regions where the substrate has its original p− doping. Then a p type implantation is done with a dosing and an intensity such that the impurities go through the oxide wherever it is less thick and are stopped wherever it is thicker and wherever there is polycrystalline silicon.

Other features and advantages of the invention will be apparent from the following detailed description made with drawings, of which.

Figure 1:
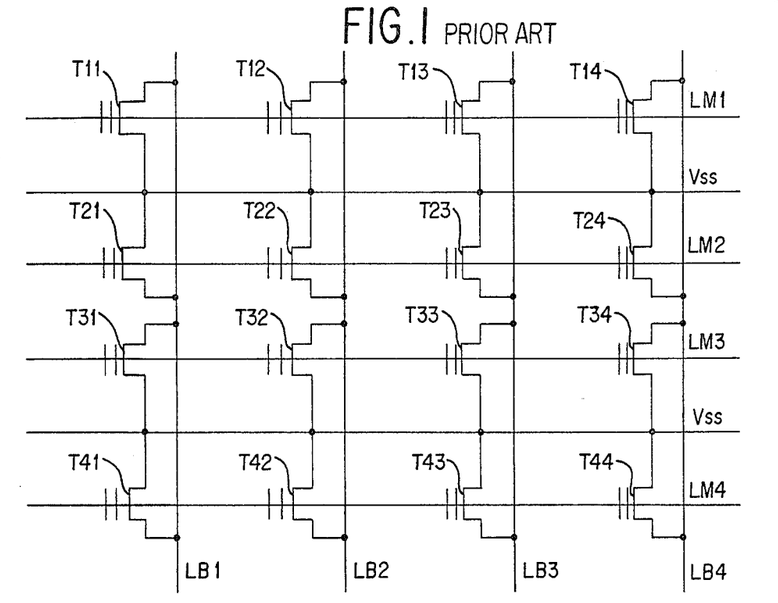
FIG. 1 recalls the architecture of a standard EPROM.

In figure which shows an EPROM of standard architecture, Tij designates the various transistors with floating grids constituting the array of memory cells where i is a row index and j is a column index. Thus, the transistors T11 to T14 are those of the first row, the transistors T21 to T24 are those of the second row etc.

Similarly, the transistors T11 to T41 are those of the first column, the transistors T12 to T42 are those of the second column, etc.

Each transistor has a floating grid and a control grid as well as two semi-conducting regions (source and drain) with a first type of conductivity, separated by a channel region with an opposite type of conductivity covered by the control grid.

The control grids of the transistors of the same row are all connected to the same word line, LM1 to LM4 for the rows 1 to 4 respectively.

The drains of the transistors of the same column are all connected to the same bit line, LB1 to LB4 for the columns 1 to 4 respectively.

The word lines are conductors (in practice made of polycrystalline silicon) which extend along a horizontal direction (that of the rows). The bit lines are conductors extending in a vertical direction (that of the columns).

The sources of all the transistors are connected to a common low potential Vss.

Figure 2:
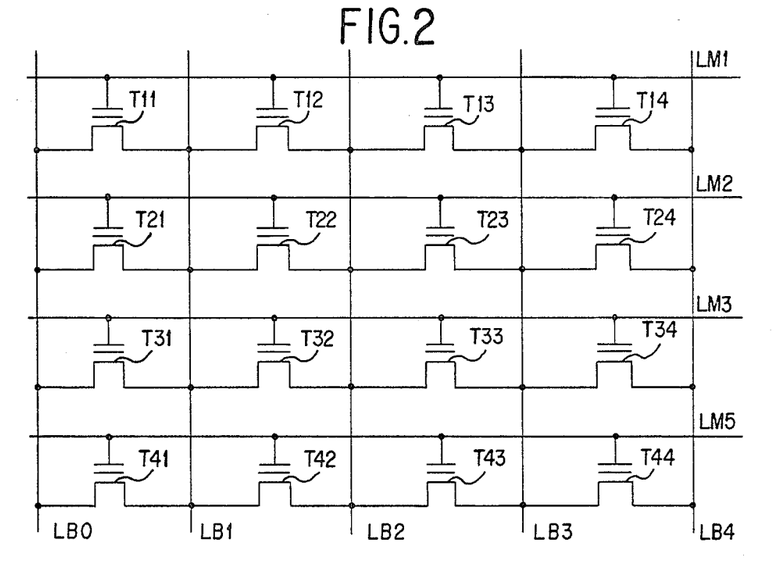
FIG. 2 gives a schematic view of the architecture of an EPROM according to the invention.

By contrast with this standard architecture, the present invention proposes a different architecture shown in FIG. 2.

In the architecture shown in FIG. 2, the transistors are still arranged in an array of rows and columns, the transistors of the first row being still designated by T11 to T14 and those of the second row by T21 to T24, while the transistor Tij more generally designates the transistor at the intersection of the row i and the column j.

The control grids of the transistors of the row i are all still connected to a conductor, having a generally horizontal direction and called a word line LMi.

Conductors with a generally vertical direction constitute bit lines LBj. However, unlike the case of FIG. 1, each bit line is connected, firstly, to all the transistors of the column located immediately to the right of this bit line and, secondly, to all the transistors of the column located immediately to the left of this bit line (except, of course, for the bit lines at the ends, one of which has no transistors to its left while the other has no transistors to its right).

Thus, taking for example the second column of transistors T12 to T42 and the third column of transistors T13 to T43, it can be seen in FIG. 2 that all the transistors of the second column have their drains connected to a column conductor LB2 and all the transistors of the third column have their sources connected to this same column conductor LB2.

The designation "source" or "drain" is not very important in this architecture and it is enough to bear in mind that if a transistor has one of its source or drain regions connected to a bit line, it will then have its other region (drain or source) connected to a bit line immediately adjacent to the first bit line.

Before describing the way to set up this architecture in practice, we shall now show how this memory operates in read and write modes.

In the write mode, a memory cell is programmed by charging its floating grid through injection of hot carriers, i.e. by applying a potential to the control grid, while the transistor conducts a current, between its source and drain regions, which is sufficiently high for the charge carriers (electrons) to be attracted to and trapped in the floating grid. This injection mode is a standard one but, in this case, caution must be taken since the transistors are not connected between a bit line and a ground at Vss but are connected between two bit lines. The notion of a bit line corresponds to a conductor capable of conveying the piece of information contained in a memory cell. In this sense, a Vss ground line is not a bit line.

Hence, to make the memory operate in the writing mode, the following procedure is followed:
- it is assumed that the cell to be programmed is the transistor Tij at the intersection of the row i and the column j;
- the bit line LBj located immediately to the right of the column j and all the other bit lines located to the right of the column j are raised up to a high potential Vcc (of 5 volts in practice) which may be also called a drain potential;
- the bit line located immediately to the left of the column j and all the other bit lines located to the left of the column j are set to a low potential Vss which may also be called a source potential.

Thus, only the transistors of the column j have a drain potential that differs from their source potential; as a matter of fact the transistors of the columns further to the right have a potential Vcc on their drain and on their source, and the transistors of the columns further to the left have a potential Vss on their drain and on their source. The transistors of the column j have a potential Vss on the left-hand side (which shall be called the source side) and a potential Vcc on the right-hand side (which shall be called the drain side). Of course, the notions of right and left are used purely for convenience's sake and the directions in which the potentials are applied can be reversed.

Consequently, only the transistors of the column j can, as the case may be, conduct a current and can therefore have hot carriers injected in their floating grid. The others will not be able to do so.

The injection, however, will be done only for transistors which have their grid raised up to a sufficiently high potential called a "Vpp programming potential".
Two cases are possible:
- either the information to be written in the transistor Tij is a logic "zero" and no charge should then be injected into its floating grid; in this case all the word lines are taken to a potential that is low (for example Vss) to prevent any injection;
- or the information to be written in the transistor Tij is a logic "one" and a charge should be stored in its floating grid; in this case, the word line LMi (connected to the transistors of the row i) is raised up to the programming potential Vpp which, in practice, is about 15 volts.

All the other word lines are maintained to a low potential (for example, Vss=0 volt).

Of course, the notion of logic "zero" and logic "one" is an arbitrary one, and it is quite possible to make logic "zero" correspond to an injection of charges in the floating grid.

The reading operation of the piece of information contained in a memory cell is quite similar to the writing operation.

A read potential is applied to the word line LMi containing the cell to be read, and a low potential is applied to all the other word lines. The read potential applied to the word line LMi is high enough to make a transistor, the floating grid of which has not received an injection of charges, conductive and it is low enough not to make a transistor, the floating grid of which has received an injection of charges, conductive. The low potential applied to the other lines cannot make a transistor conductive, whether or not said transistor has undergone an injection of charges.

The low potential is, for example, Vss. The read potential is, for example, Vcc (about 5 volts).

As in the write operation, a low potential (for example Vss) is applied to all the bit lines located to the left of the column j and a high potential (in principle Vcc through a resistive load) is applied to all the bit lines located to the right of the column j. Thus, only the transistors of the column j can, as the case may be, conduct a current (provided that they are made conductive by their control grids); the other transistors have the same potential on their drains and sources and do not conduct any current even if the potential of their grids is sufficient to make them conductive.

The transistors of the column j have their source at Vss and their drain at Vcc. Among these transistors, those that do not belong to the row i have their grid at the low potential which prevents them from being made conductive. The transistor Tij of the row i, for its part, has its control grid raised to the read potential (Vcc in principle). If it has not undergone any storage of charges in its floating grid, it will be made conductive and will effectively conduct a current between its drain and its source. If it has had charges stored in it, the read potential will not be sufficient to make it conductive, and no current between will flow its grid and its drain.

The read operation therefore consists of a detection of the current flowing between the two bit lines connected to a selected column of transistors.

As with the write operation, the reading operation of this memory is different from that of a standard memory in that it requires the application of a potential Vss to all the left-hand columns and a potential Vcc to all the right-hand columns instead of a potential Vcc to a selected column and Vss to all the other columns.

There will be now described a practical embodiment of this memory showing, especially, how the proposed architecture removes the need to provide, within the array of memory cells, insulation by a thick layer of oxide between the drains of transistors of adjacent columns. This insulation was absolutely necessary n the standard architecture of FIG. 1.

Figure 3:
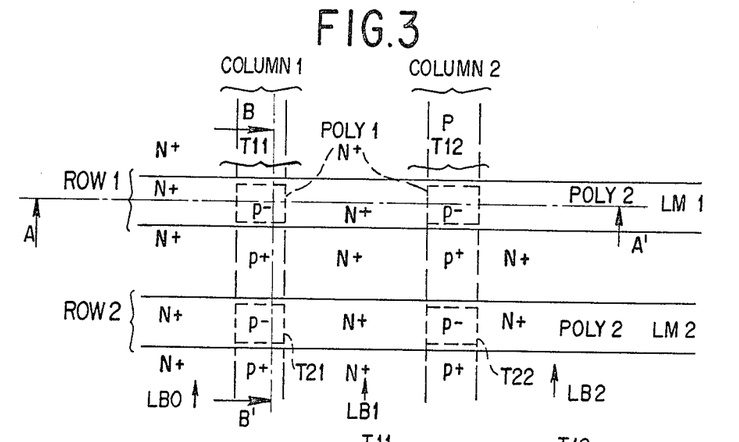
FIG. 3 gives a schematic top view of the relative implantation of four adjacent memory cells on a silicon wafer.
Figure 4:
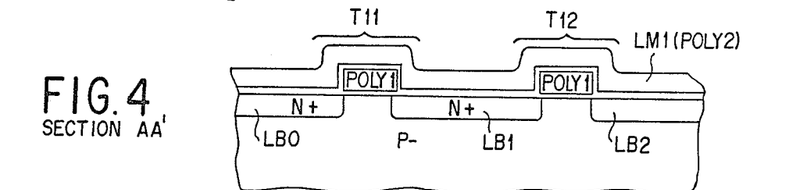
FIG. 4 a sectional view of FIG. 3 along a line AA' parallel to a word line of the memory.
Figure 5:
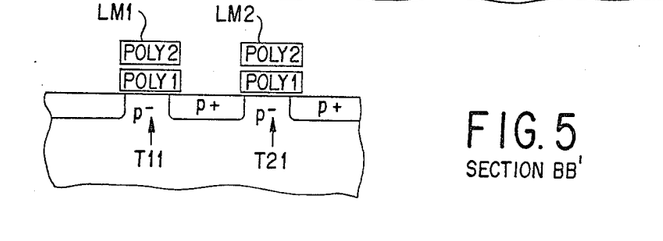
FIG. 5 shows a sectional view of FIG. 3 along a line BB' parallel to a bit line of the memory, i.e. parallel of the memory.

FIGS. 3, 4 and 5 should be looked at together. They show a schematic view of four adjacent cells of the memory which correspond, for example, to the four transistors T11, T12, T21 and T22 of FIG. 2.

The transistors are, for example, n type channel transistors formed in a p− type epitaxial silicon substrate.

Each transistor has an n+ type source region and a n+ type drain region. These two regions are separated by a p− type channel region covered with a floating grid. The floating grid is insulated from the channel by an insulating thin layer (of silicon oxide). This floating grid is itself covered with a control grid and insulated from it by another insulating thin layer.

The floating grids are polycrystalline silicon rectangles obtained by etching a first layer of polycrystalline silicon called the "first polycrystalline silicon level" '(poly 1). The control grids are narrow strips of polycrystalline silicon obtained by etching a second layer of polycrystalline silicon called the "second level of polycrystalline silicon" (poly 2). These strips extend in the direction of the horizontal rows of the array and constitute both the control grids and the word lines which connect these grids.

The bit lines are n+ type highly doped strips that are diffused in the surface of the silicon substrate on either side of the columns of transistors. These diffused lines are both the bit lines and the source and drain regions of the transistors which have to be connected to these bit lines according to the architecture of FIG. 2.

At the position of a transistor, the bit line to the right of this transistor is insulated from the bit line to the left of this transistor. This insulation results quite simply from the presence of the transistor channel. But, outside the positions of the transistors, i.e. between the rows of transistors, a specific insulation should be provided between the adjacent bit lines (n+ regions).

In the structure proposed herein, the insulation is done by means of p type regions which are more highly doped than the channel regions of the transistors. These p type regions extend in the space between two adjacent bit lines between the channels of the two transistors in adjacent rows.

In the explanatory sections shown in FIGS. 4 and 5, it can be seen that each transistor has a p— type channel covered by the floating grid, the channel being bordered to the right and to the left by n+ type strips extending throughout the height (in the direction of the columns) of the memory block. These strips act as both sources and drains for two adjacent columns of transistors and as bit lines for data transmission to and from the memory. Moreover, the channel is bordered at the top and bottom by p or p+ type regions which separate two adjacent transistors of the same column. Finally, in practice, the polycrystalline silicon strips of the second level forming the word lines and control grids extend horizontally over the channels of the transistors as well as over portions of n+ regions forming the bit lines.

In a standard way, which does not have to be described in detail herein, the conductivity of the diffused bit lines can be improved by superimposing, on these lines, metallic conductors insulated from the word lines and making contact with the bit lines from place to place. As for the word lines, their conductivity can be improved by covering the polycrystalline silicon, of which they are made, with a metallic silicide.

Figure 6:
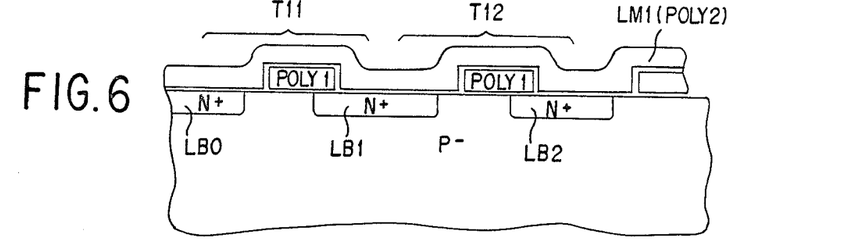
FIG. 6 an alternative embodiment of the invention in a longitudinal section similar to that of FIG. 4.

An alternative embodiment of the invention is shown in FIG. 6. This figure is equivalent to FIG. 4, i.e. it shows a longitudinal section through the channels of two adjacent transistors of the same row.

The difference compared with FIG. 4 is that the floating grids are offset with respect to the channels of the transistors, that is with respect to the p— type regions extending between the n+ type bit lines.

As will be seen in FIG. 6, the floating grids extend over only one part of the channel, the other part being directly covered by the control grid (with a thin layer of insulating material between the control grid and the channel). That part of the channel which is covered with the control grid is the part on the source side, namely the part which is at Vss for the n type channel transistors.

This arrangement is designed to prevent the capacitive coupling, between the floating grid and the drain of the transistors, from inducing any disturbance in the operation of the memory during the write operation.

As a matter of fact, in the case of FIG. 4, the following phenomenon takes place: during the write operation, an entire column of transistors has its drain raised to Vcc. The capacitive coupling between the drain and the floating grid tends to raise the potential of the floating grid to a value which is small but enough to start making the channel of the transistor very slightly conductive.

Since this phenomenon occurs simultaneously for all the conductors of the column, the total conduction is not negligible and the current that flows through all these parallel-connected transistors tends to cause a drop in the drain potential of these transistors. In particular, the drain potential of the transistor to be programmed becomes substantially smaller than Vcc, and this harms programming quality.

The embodiment shown in FIG. 6 prevents this drawback, not by reducing the capacitive coupling between source and drain (on the contrary, this capacitive coupling is increased) but by dividing the channel of the transistors into two parts, one part covered by the floating grid and one part covered solely by the control grid. In this way, even if the capacitive coupling between the drain and the floating grid raises the potential of the floating grid, this increase cannot, in any case, make that part of the channel, which is not covered by the floating grid, conductive. Now, all the transistors of the column, except one, have their control grids at a potential Vss which prevents any conduction of that part of the channel which is not covered by the floating grid. The drawback of the embodiment of FIG. 4 therefore no longer exists.

There will be now described a method of implementation which is particularly useful for the present invention. This method can be used to easily make both the memory block in which the transistors with floating grids are not separated by thick oxide layer zones and then peripheral circuits in which the transistors are separated in a standard way by by thick oxide layer zones. The method described below corresponds to the manufacture of peripheral circuits in CMOS technology.

Figure 7:
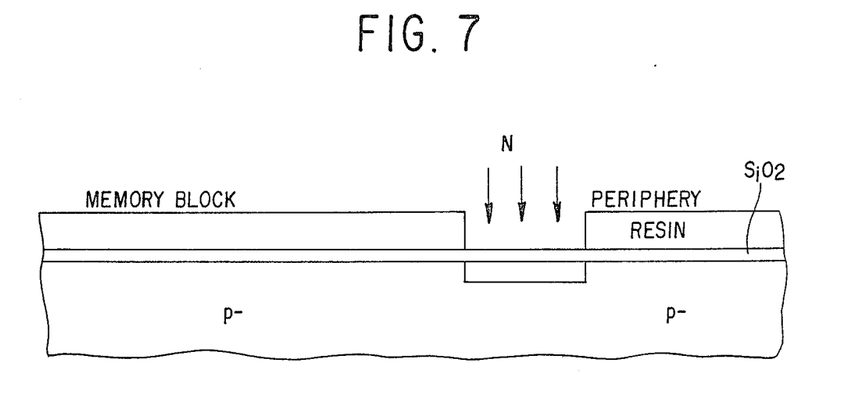
FIGS. 7 to 13 represent the various stages of the manufacturing method according to the invention.

The method starts with a p— type epitaxial silicon substrate, and a thin layer of silicon oxide is formed on the surface. This layer is covered with a photosensitive resin layer which is etched to define n-type wells in which the p channel transistors of the peripheral circuits will be formed. An n type impurity is implanted in a place where the resin does not protect the substrate, and the resin is removed. FIG. 7 shows the structure before the resin is removed.

Then, heat treatment is applied to cause the impurity to be diffused down to a depth of about 3 to 4 microns, thus defining the n type wells.

The oxide on the surface of the substrate is removed, and a thin layer of silicon oxide, of about 100 to 200 angstroms, is grown again. Then, a layer of silicon nitride is deposited. This silicon nitride layer is designed to define the thick oxide layer zones in the peripheral circuits.

The nitride is photo-etched according to the pattern corresponding to the desired thick oxide layer zones and the thick oxide layer is grown (to about 0.5–0.6 microns) where the substrate is not protected by nitride.

Figure 8:
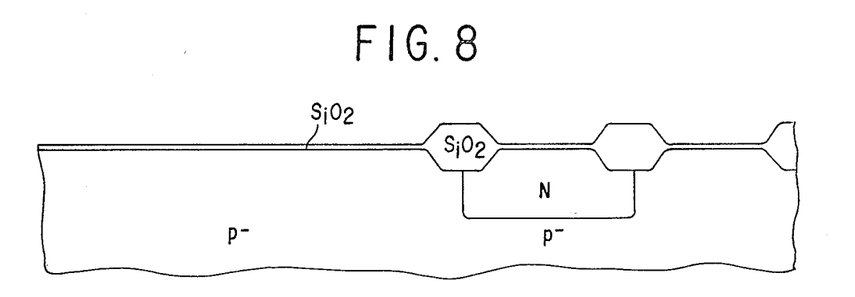

The nitride and the thin oxide layer are eliminated, and a new thin layer of silicon oxide is grown again uniformly. FIG. 8 shows the structure at this stage of manufacture.

Then a uniform layer of polycrystalline silicon (first level: poly 1) is deposited. This polycrystalline silicon layer is about 2000 angstroms thick and has an n type doping.

The first level of polycrystalline silicon is etched in a pattern of vertical strips in the memory block. These vertical strips define the gaps between the bit lines.

Figure 9:
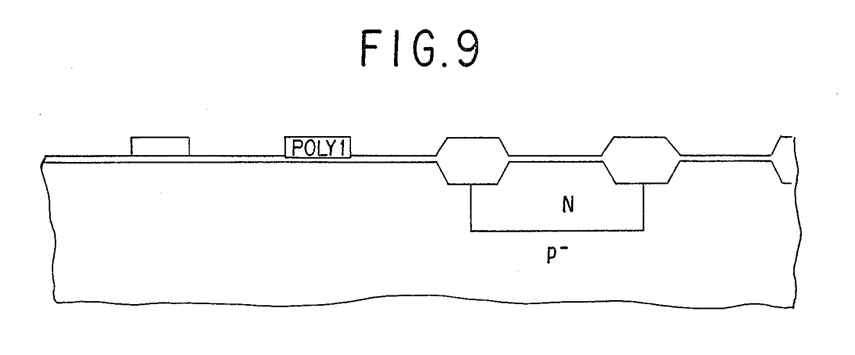

FIG. 9 shows the substrate at this stage of manufacture.

Resin is then used to protect the periphery which should not undergo any n type implantation at this stage. An arsenic implantation is made where the silicon substrate is protected neither by the resin nor by the first level of polycrystalline silicon. This implantation defines the n+ type bit lines, LBo, LB1, etc.

Figure 10:
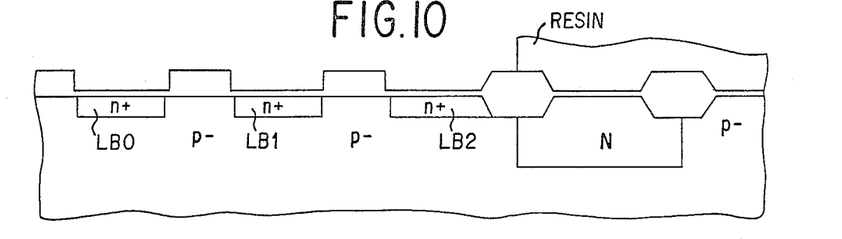

FIG. 10 shows the structure at this stage of manufacture.

The resin is then removed.

It must be noted that the implantation of arsenic after the depositing and etching of the first level of polycrystalline silicon corresponds to the alternative of FIG. 4 but not to that of FIG. 6. For the alternative of FIG. 6, the arsenic implantation has to be done through a resin mask, and then the resin must be removed and the polycrystalline silicon must be etched in a pattern which is not self-aligned with the pattern of arsenic doped strips.

Then a thin layer of silicon oxide is grown both on the substrate and on the first level of polycrystalline silicon. The memory block is covered with resin and the thin layer of oxide is removed outside the memory block. The resin is removed and a thin layer of silicon oxide is grown again. This thin layer of silicon oxide will insulate the grid from the peripheral transistors. This layer is about 300 angstroms thick.

Then a second layer of polycrystalline silicon (second level: poly 2) is deposited and, if necessary, at this stage a metallic silicide is formed on this layer in order to increase the conductivity of the layer.

Figure 11:
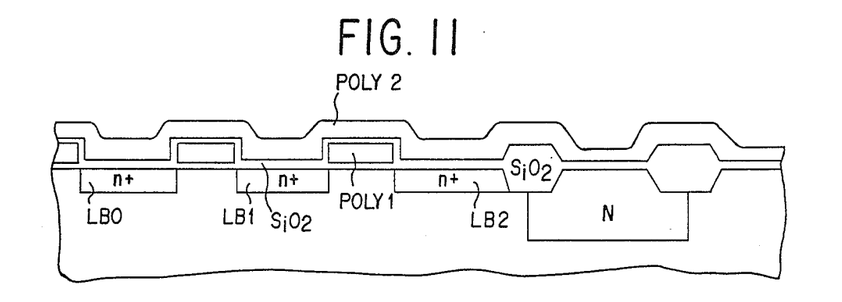

FIG. 11 shows the structure at this stage.

By depositing, insulating and developing a resin mask, he polycrystalline silicon is protected in the zones where it is desired that it should remain, and is eliminated wherever it is not protected. The pattern that remains corresponds, firstly, to the word lines in the memory block and, secondly, to the transistor grids and other desired connections outside the memory block. There is now a structure with vertical lines of the polycrystalline silicon of the first level and horizontal lines of the second level. Hence, a new etching of the first level must be done in order to preserve only rectangles that define the floating grids of the transistors of the memory block. It is therefore necessary to eliminate the first level of polycrystalline silicon between the horizontal strips of the second level and to leave it only beneath these strips.

For this purpose, the resin which was used to define these strips is left in place (instead of removing it as is usually done after etching the polycrystalline silicon), and it is hardened by ultra-violet radiation. In this way, it is possible to deposit and spread a new layer of resin without removing the resin pattern and then to insolate and develop this resin according to a pattern which protects the entire periphery and strips the memory block.

There is now a structure in which the word lines of the memory block are protected by the first resin layer and all the peripheral circuits are protected by the second resin layer.

The etching of the polycrystalline silicon not protected by either of the resin layers is then continued, and the result of this operation is the disappearance of the first polycrystalline silicon layer between the horizontal strips of the second layer.

Both layers of resin are then removed.

Figure 12:
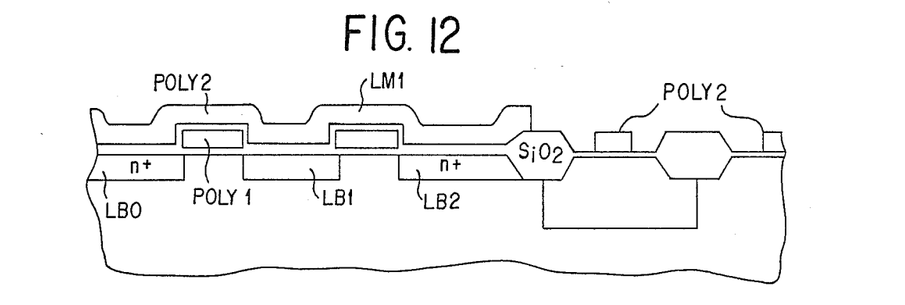
Figure 13:
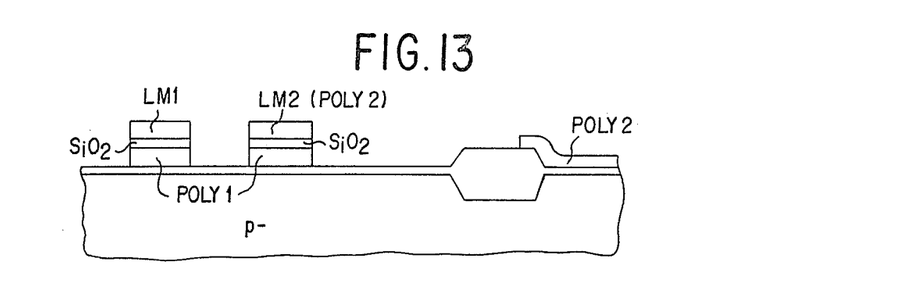

FIGS. 12 and 13 show the structure at this stage of manufacture. FIG. 12 corresponds to a horizontal section similar to that of FIG. 4, and FIG. 13 corresponds to a vertical section similar to that of FIG. 5.

At this stage, a p type impurity must be implanted between the transistors of adjacent rows, but only in the gap between the diffused bit lines. A specific resin mask could be used to define the implantation zones, but it is preferred to use the method described below. The substrate is oxidized at a relatively low temperature (800° to 900° C.) and in a damp atmosphere.

The oxide grows far more quickly in the n+ type regions of the substrate than in the p− type regions. The oxidation is continued until about 2000 angstroms of oxide are obtained in the n+ regions and only 500 to 600 angstroms in the p− type regions. Now, it is precisely the p− type regions, not covered by the word lines, that should undergo a p type implant while the n+ type regions, which are bit lines, should not undergo this implantation.

Oxide of varying thickness is therefore used as the p type impurity implantation mask. However, a protective resin is deposited. This resin is etched so that it remains only in the peripheral zones and thus prevents implantation in these zones.

For example, boron is implanted, having sufficient energy to go through the oxide covering the n+ type zones and to go through the polycrystalline silicon wherever it is present.

Thus the configuration of FIGS. 4 and 5 (or 6 and 7) is finally obtained.

The remaining steps of the method correspond to the normal manufacture of CMOS transistors in the peripheral zones: the memory block and the n type channel transistors are protected with a resin mask, and the source and drain regions of the p type channel transistors are implanted. A glass that flows at low temperature (900° to 950° C.) is deposited: for example, a glass containing 4% of boron and 5% of phosphorus so that the flow does not lead to excessive lateral diffusion of the n+ type regions of the substrate.

Contact holes are etched in this glass layer for the connection of certain monocrystalline or polycrystalline silicon regions with a metallic interconnection layer. Then a metallic layer (aluminum) is deposited, and finally it is etched.

In particular, it is possible to provide for metallic lines superimposed on the bit lines (but insulated from one another by the glass). These metallic lines come into contact from place to place with the n+ type bit lines. For example, For example, one contact may be provided at every 8 or 16 rows of transistors. The number of contacts planned should not be excessive as they make it necessary to increase the space between two consecutive word lines.

Although this detailed description corresponds to memories with floating grids, the new architecture proposed can be applied to other types of memories, including read-only memories.

I claim:

1. A memory comprising an array of word lines that connect cells in rows and bit lines that connect cells in columns, the word lines being conductors used to designate a specific row of cells and the bit lines being conductors used to transmit a piece of information on the logic state of the cells that are connected to them, each cell comprising a floating grid transistor having a floating grid, a control electrode connected to a word line, and source and drain electrodes, one connected to a first bit line, and the other connected to another bit line adjacent to the first bit line, this other bit line being itself connected to a source or drain electrode of a transistor of a column adjacent to a column of which the considered cell forms a part, wherein the transistors of one group belonging to two adjacent rows and two adjacent columns are arranged as follows:

the floating grid of each transistor essentially consists of a conductive rectangle located above a zone having a first type of conductivity constituting the channel of the transistor;

the channels of two adjacent transistors of the same column are separated by a region having the same type of conductivity as the channels;

the channels of two adjacent transistors of the same row are adjacent to and separated by a common region having an opposite type of conductivity, which acts as a source for one of the transistors and a drain for the other transistor;

there is no thermally grown thick oxide to separate the transistors from one another either in a same row or in a same column.

2. A memory according to claim 1 comprising programming means arranged to apply the following potentials to the different cells, as follows:

a low potential Vss is applied to the word lines of the row of cells which should not be programmed;

a programming potential Vpp is applied to the word line connected to the cell to be programmed;

a drain potential Vcc is applied to all the bit lines located on one side of the column containing the cell to be programmed, and a source potential is applied to all the bit lines located on the other side of the column containing the cell to be programmed;

the source potential, drain potential and programming potential being such that any transistor, which has one main electrode at the source potential, the other main electrode at the drain potential and its control electrode at the programming potential, will be programmed and any transistor which has either its two main electrodes at the same potential or its control electrode at low potential will not be programmed.

3. A memory according to claim 1 or 2 wherein the transistor has a floating grid, a control grid, a source region and a drain region, and a channel region between the source and drain regions, the floating grid extending over only one part of the channel region and the control grid extending over the rest of the channel region.

4. A method for manufacturing a floating grid memory according to claim 1, from a p− type substrate, wherein firstly n+ type diffused bit lines are formed between columns of transistors and, secondly, floating grids are formed at each transistor position and, finally, word lines are formed constituting, at the same time, control grids for the transistors, the method further comprising an oxidation step, performed under conditions such that the oxide formed is substantially thicker in places where it covers n+ type doped regions than in places where it covers the p− type substrate, and comprising a step for the implantation of a p type impurity which is masked by the thicker layer of oxide and is not masked by the thinner layer of oxide.

5. A memory according to claim 1, comprising programming means arranged to apply the following potentials to the different cells, as follows:

a low potential Vss is applied to the word lines of the rows of cells which should not be programmed;

a programming potential Vpp is applied to the word line connected to the cell to be programmed;

a drain potential Vcc is applied to all the bit lines located on one side of the column containing the cell to be programmed, and a source potential is applied to all the bit lines located on the other side of the column containing the cell to be programmed;

the source potential, drain potential and programming potential being such that any transistor which has one main electrode at the source potential, the other main electrode at the drain potential and its control electrode at the programming potential, will be programmed and any transistor which has either its two main electrodes at the same potential or its control electrode at low potential will not be programmed.

6. A memory according to claim 1 or 5 wherein the floating grid of a transistor extends over only one part of the channel of the transistor, and the control electrode extends over the rest of the channel.

7. A method for manufacturing a floating grid memory according to claim 1, from P− type substrate, wherein firstly N+ type diffused bit lines are formed between columns of transistors and, secondly, floating grids are formed at each transistor position and, finally, word lines are formed constituting, at the same time, control electrodes for the transistors, the method further comprising an oxidation step, performed under conditions such that the oxide formed is substantially thicker in places where it covers N+ type doped regions than in places where it covers the P− type substrate, and comprising a step of implantation of a P type impurity which is masked by the thicker layer of oxide and is not masked by the thinner layer of oxide.

* * * * *